United States Patent
Kim et al.

(10) Patent No.: US 7,778,096 B2
(45) Date of Patent: Aug. 17, 2010

(54) FLASH MEMORY DEVICE

(75) Inventors: You Sung Kim, Seoul (KR); Duck Ju Kim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 124 days.

(21) Appl. No.: 12/119,405

(22) Filed: May 12, 2008

(65) Prior Publication Data

US 2009/0027966 A1 Jan. 29, 2009

(30) Foreign Application Priority Data

Jul. 25, 2007 (KR) ....................... 10-2007-0074574

(51) Int. Cl.
*G11C 7/00* (2006.01)
(52) U.S. Cl. ............. 365/200; 365/189.05; 365/189.07; 365/236
(58) Field of Classification Search ................. 365/200, 365/189.07, 189.05, 236
See application file for complete search history.

(56) References Cited

U.S. PATENT DOCUMENTS

2002/0012282 A1* 1/2002 Saito et al. .................. 365/200
2002/0069381 A1* 6/2002 Jeong et al. .................. 714/704
2004/0090847 A1* 5/2004 Takeuchi et al. ............ 365/200

FOREIGN PATENT DOCUMENTS

KR 1020060006554 A 1/2006

\* cited by examiner

*Primary Examiner*—Son Dinh
(74) *Attorney, Agent, or Firm*—Townsend and Townsend and Crew LLP

(57) ABSTRACT

A bad block address of a flash memory device is stored through a fuse circuit and then compared with an input address in order to disable bad blocks. The flash memory device includes a bad block information unit for storing an address of a bad block, a comparator for comparing an input address including a memory block address and the address of the bad block stored in the bad block information unit, and for outputting a first control signal according to the comparison result, and an address counter for outputting a second control signal to enable or disable a memory block corresponding to the memory block address in response to the first control signal.

14 Claims, 2 Drawing Sheets

FLASH MEMORY DEVICE

CROSS-REFERENCES TO RELATED APPLICATIONS

The present application claims priority to Korean patent application number 10-2007-74574, filed on Jul. 25, 2007, which is incorporated by reference in its entirety.

BACKGROUND OF THE INVENTION

The present invention relates to flash memory devices and, more particularly, to a flash memory device which performs address control based on bad block information.

In flash memory devices, a bad block refers to a block that cannot be repaired even through column repair. Bad blocks should be generally 2% or less of all of the blocks in a data page.

A determination is made whether a block is bad at the time of a wafer test during the manufacturing process of a flash memory device. A memory block, which is determined to be a bad block, is disabled in hardware by cutting a block fuse in a path that enables a corresponding block.

The block fuse functions to make impossible the enabling of a word line of the block, thereby disabling the operation of a corresponding block.

FIG. 1 is a circuit diagram of a block select circuit employing a conventional block fuse. This drawing shows a partial block select circuit that outputs a block enable signal. Referring to FIG. 1, the block select circuit includes first and second PMOS transistors P1, P2, first and second NAND gates NA1, NA2, and a fuse F.

The first and second PMOS transistors P1, P2 are connected in series between a power supply voltage node and a node a1. The gates of the first and second PMOS transistors P1, P2 are commonly connected to a ground node. Thus, the first and second PMOS transistors P1, P2 are always turned on.

The first NAND gate NA1 outputs input block addresses XA, XB, XC and XD to the node a1. The block addresses XA, XB, XC and XD are decoded by employing a row address input together with a program or read operation command of a flash memory device.

A fuse F is connected between the first NAND gate NA1 and the node a1.

The output of the first NAND gate NA1 is decided by the block addresses XA, XB, XC and XD. When the block addresses XA, XB, XC and XD are a high level, the first NAND gate NA1 outputs a low-level signal, thereby making the node a1 have a low level. When a control signal PGM-PREb of a low level is input, the second NAND gate NA2 outputs a low-level signal, and the enable signal is input to a block corresponding to the block addresses XA, XB, XC and XD.

This block select circuit is connected to every block. The enable signal is not input to a block that is a bad block by cutting the fuse F.

A bad block refers to a memory block having failed memory cells that cannot be corrected through column repair. In flash memory devices, the percentage of bad blocks generally falls within 2%. A determination of whether a block is bad is performed during a wafer test of a flash memory device.

In order to disable the bad block, fuses are necessary in all of the memory blocks. Accordingly, the area occupied by the fuses is large.

BRIEF SUMMARY OF THE INVENTION

The present invention is directed towards a flash memory device in which a bad block address of the flash memory device is stored through a fuse circuit and then compared with an input address to disable bad blocks.

A flash memory device according to an aspect of the present invention includes a bad block information unit for storing an address of a bad block; a comparator for comparing an input address including a memory block address and the address of the bad block stored in the bad block information unit, and for outputting a first control signal according to the comparison result; and an address counter for outputting a second control signal to enable or disable a memory block corresponding to the memory block address in response to the first control signal.

The bad block information unit includes fuse circuits for storing a bad memory block address of the flash memory device.

The bad block information unit includes storage means for storing information of a bad memory block.

A flash memory device according to another aspect of the present invention includes a memory cell array including a plurality of memory blocks, each memory block including a plurality of memory cells each connected to a bit line pair and a word line; a page buffer unit including a plurality of page buffer circuits, the page buffer circuits being constructed to program the memory cells, move a threshold voltage of the memory cells in a positive voltage direction and read data of the memory cells; an X decoder for selecting a word line of the memory cell array according to an input address; a Y decoder connected to each of the page buffer circuits and a data I/O line, wherein each Y decoder transmits program data to the corresponding page buffer circuit or outputs data received from the corresponding page buffer circuit to the data I/O line; and a controller for outputting control signals of the page buffer, the X decoder and each Y decoder and for outputting an address control signal depending on whether an address of a memory block included in the input address is an address of a bad block.

The controller comprises an address controller for comparing the memory block address included in the input address with previously stored bad block memory information, and for outputting an address control signal according to the comparison result.

The address controller includes a bad block information unit for storing address information of a bad memory block included in the flash memory device; a comparator for comparing the memory block address included in the input address and a memory block address included in the bad block information unit, and for outputting a block disable signal according to the comparison result; and an address counter for outputting an address count signal according to an operational progress of the flash memory device using the input address as a start address, and for outputting an address count signal to disable a corresponding block in response to the block disable signal.

The bad block information unit includes fuse circuits for storing an address of the bad memory block of the flash memory device.

The bad block information unit includes storage means for storing information of the bad memory block.

The X decoder disables an operation of a corresponding memory block according to the address count signal for block disabling of the address counter.

A flash memory device according to still another aspect of the present invention includes a memory cell array including a plurality of memory blocks, each memory block including a plurality of memory cells each connected to a bit line pair and a word line; a page buffer unit including a plurality of page buffer circuits, the page buffer circuits being constructed to program the memory cells, move a threshold voltage of the memory cells in a positive voltage direction and read data of the memory cells; an X decoder for selecting a word line of the memory cell array according to an input address; Y decoders each connected to one of the plurality of page buffer circuits and a data I/O line, wherein the Y decoders transmit program data to the page buffer circuit or output data received from the page buffer circuit to the data I/O line; an address controller for outputting an address control signal depending on whether the memory block address included in the input address is an address of a bad block; and a controller for outputting a control signal for controlling an operation of the page buffer unit, the X decoder and the Y decoders.

The address controller includes a bad block information unit for storing address information of a bad memory block included in the flash memory device; a comparator for comparing the memory block address included in the input address and a memory block address included in the bad block information unit, and for outputting a block disable signal according to the comparison result; and an address counter for outputting an address count signal according to an operational progress of the flash memory device using the input address as a start address, and for outputting an address count signal for disabling a corresponding block in response to the block disable signal.

The bad block information unit includes fuse circuits for storing an address of the bad memory block of the flash memory device.

The bad block information unit includes storage means for storing information of the bad memory block.

The X decoder disables an operation of a corresponding memory block according to the address count signal for block disabling of the address counter.

DESCRIPTION OF SPECIFIC EMBODIMENTS

A specific embodiment according to the present invention will be described with reference to the accompanying drawings. However, the present invention is not limited to the disclosed embodiment, but may be implemented in various manners. The embodiment is provided to complete the disclosure of the present invention and to allow those having ordinary skill in the art to understand the present invention. The present invention is defined by the scope of the claims.

Figure 1:
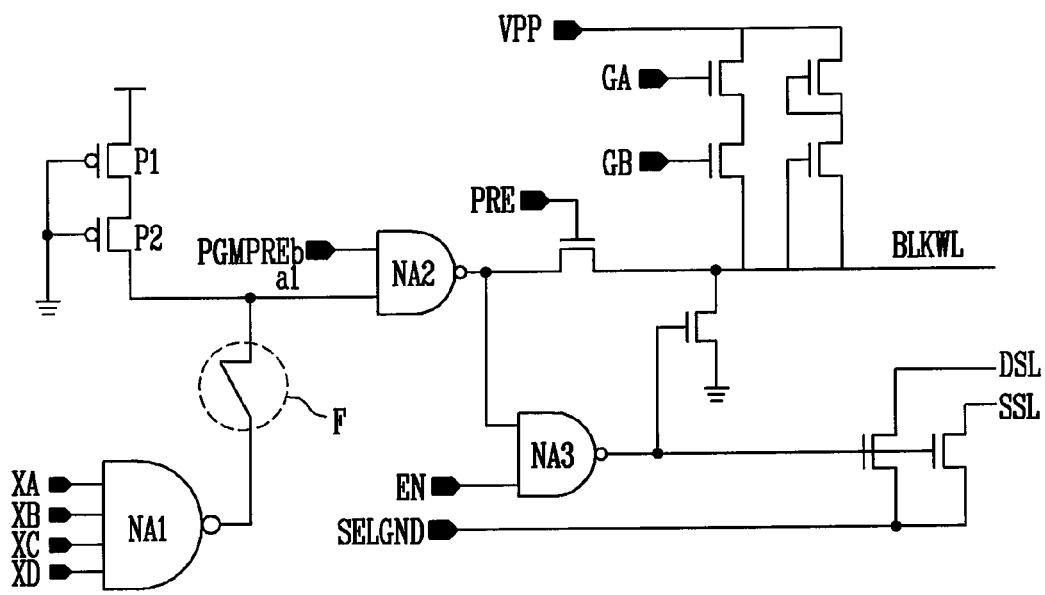
FIG. 1 is a circuit diagram of a block select circuit employing a conventional block fuse.
Figure 2A:
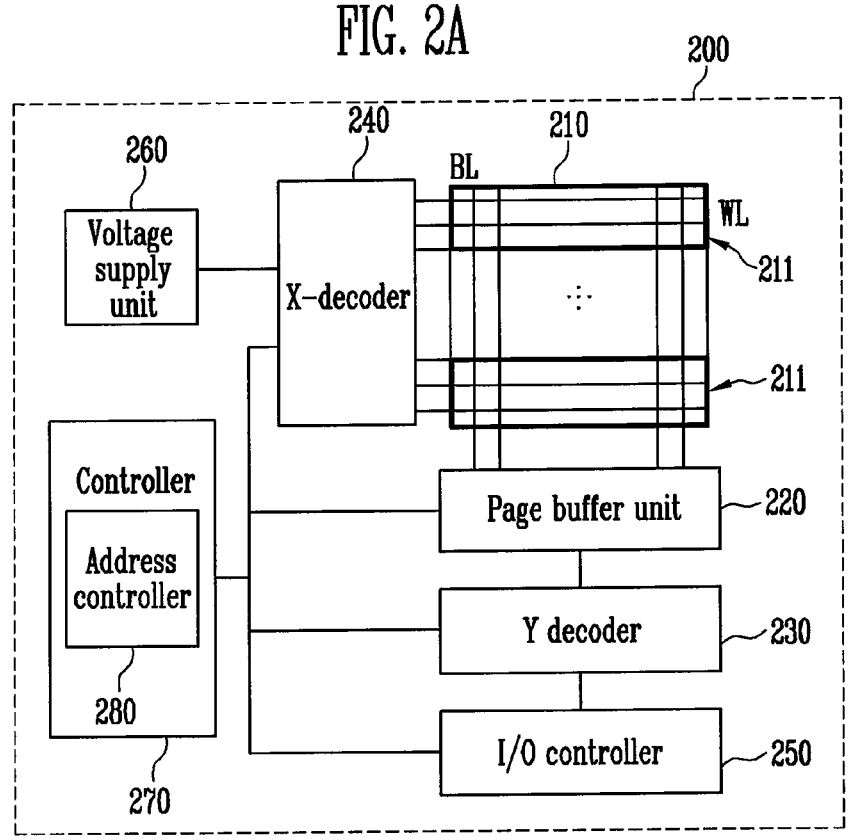
FIG. 2A is a block diagram showing the construction of a flash memory device according to an embodiment of the present invention.

FIG. 2A is a block diagram showing the construction of a flash memory device according to an embodiment of the present invention.

Referring to FIG. 2A, a flash memory device 200 according to an embodiment of the present invention includes a memory cell array 210, a page buffer unit 220, a Y decoder 230, an X decoder 240, an I/O controller 250, a voltage supply unit 260 and a controller 270. The memory cell array 210 includes memory cells for data storage. The page buffer unit 220 includes page buffer circuits for latching data to be programmed into the memory cells or reading data programmed into the memory cells. The Y decoder 230 provides a path between the page buffer unit 220 and the I/O controller 250. The X decoder 240 selects the memory cell array 210 according to a control signal output from the controller 270. The I/O controller 250 inputs or outputs data to the page buffer 220 through the Y decoder 230 or transfers externally input commands and addresses to the controller 270. The voltage supply unit 260 generates and supplies voltages for an operation. The controller 270 controls an overall operation of the flash memory device 200. The controller 270 includes an address controller 280 that outputs an address control signal based on an address input through the I/O controller 250.

The memory cells of the memory cell array 210 are connected by word lines WL and bit lines BL. The memory cell array 210 is divided into a plurality of memory blocks 211. The page buffer circuits of the page buffer unit 220 are each connected to bit line pairs. The Y decoder 230 and the X decoder 240 select the page buffer circuits or the word lines of the memory cell array 210 according to the address control signal, which is output from the address controller 280 according to an input address.

In particular, the X decoder 240 selects the memory blocks 211 of the memory cell array 210 according to the address control signal of the address controller 280, selects the word line WL of a selected memory block 210, and connects a selected memory block 211 and a selected word line WL so that voltages are supplied thereto from the voltage supply unit 260.

The controller 270 outputs a control signal for controlling the operation of each function block. The address controller 280 provides address control signals to the Y decoder 230 and the X decoder 240 based on an address input through the I/O controller 250.

The address controller 280 decodes row addresses input through the I/O controller 250 and outputs the decoded row addresses as the block addresses XA, XB, XC and XD, thereby enabling or disabling the memory blocks 211. The address controller 280 stores information about bad block addresses of bad blocks as fuse circuits. If an address of a bad block is input, the address controller 280 disables a corresponding block address.

Figure 2B:
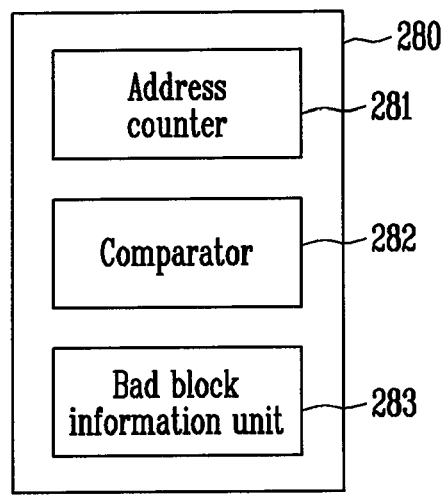
FIG. 2B is a detailed block diagram showing an address controller of FIG. 2A.

FIG. 2B is a detailed block diagram showing an address controller of FIG. 2A.

Referring to FIG. 2A, the address controller 280 according to an embodiment of the present invention includes an address counter 281, a bad block information unit 283 and a comparator 282. The address counter 281 sequentially counts and outputs input addresses. The bad block information unit 283 stores address information of bad blocks using fuse circuits. The comparator 282 compares a bad block address stored in the bad block information unit 283 with an input address. If, as a result of the comparison, a corresponding block is a bad block, the comparator 282 outputs a control signal to disable a corresponding block address.

The address counter 281 decodes an input row address, and sequentially increases and outputs an address as an operation proceeds. That is, an input row address is a first address to start an initial operation, and an address counter sequentially counts and outputs addresses subsequent to the input row address.

The bad block information unit 283 stores a block address of a memory block, which is determined to be a bad block at the time of a wafer test, by employing a fuse circuit. The fuse circuit that stores the block address can be constructed similarly to a circuit that stores a repair address. Alternatively, a bad block address can also be stored by employing a register.

The comparator 282 compares a block address included in a row address and a bad block address stored in the bad block information unit 283. If, as a result of the comparison, the bad block address is identical to the block address, the comparator 282 outputs a control signal to the address counter 281 to disable a corresponding block address.

The address counter 281 disables a block address to which the control signal is input from the comparator 282 as a low level and outputs a disabled block address, thereby preventing a corresponding memory block from operating.

As described above, the address controller 280 determines whether an input address is an address of a bad block and outputs the block addresses XA, XB, XC and XD. Accordingly, a block select circuit for selecting the memory blocks 211 within the X decoder 240 does not need a fuse.

Figure 2C:
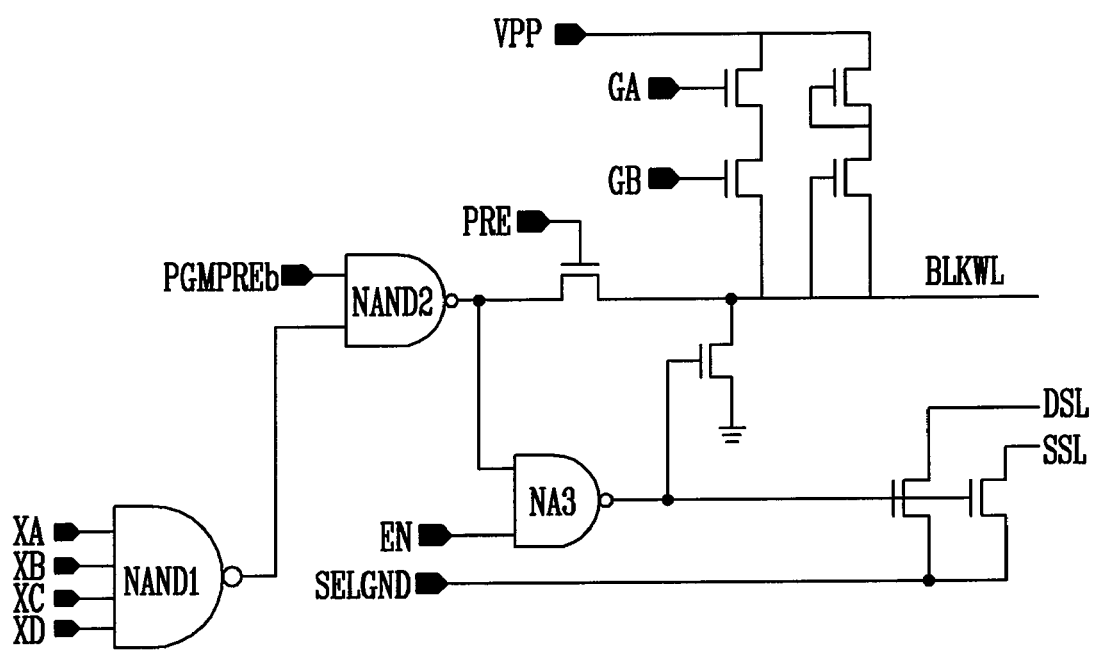
FIG. 2C is a partial circuit diagram of an X decoder of FIG. 2A.

FIG. 2C is a partial circuit diagram of the X decoder of FIG. 2A.

Referring to FIG. 2C, the block select circuit according to an embodiment of the present invention includes first and second NAND gates NAND1, NAND2. The first NAND gate NAND1 performs a NAND operation on the block addresses XA, XB, XC and XD received from the address counter 281 of the address controller 280, and outputs the operation result to the second NAND gate NAND2.

The second NAND gate NAND2 performs a NAND operation on a control signal PGMPREb and an output signal of the first NAND gate NAND1, and outputs the operation result. The memory blocks are disabled or enabled according to an output signal of the second NAND gate NAND2.

The memory blocks can be enabled or disabled according to the block addresses XA, XB, XC and XD of the address controller 280 without a fuse in the block select circuit.

When a row address is input, the address controller 280 compares a block address with a bad block address of the bad block information unit 283, and decides whether to enable the address according to the comparison result. Accordingly, it is necessary to write an operation algorithm of a flash memory device by considering the time taken to compare a bad block address stored in the bad block information unit 283 and an input address.

As described above, according to a flash memory device in accordance with the present invention, each block fuse is not included in each memory block. Bad block addresses are separately stored and compared with an input address, and memory blocks are enabled or disabled according to the comparison result. Accordingly, the number of fuse circuits can be reduced and the area occupied by the fuse circuits can be reduced.

The embodiment disclosed herein has been proposed to allow a person skilled in the art to easily implement the present invention, and the person skilled in the part may implement the present invention in various ways. Therefore, the scope of the present invention is not limited by or to the embodiment as described above, and should be construed to be defined only by the appended claims and their equivalents.

What is claimed is:

1. A flash memory device, comprising:
an address controller comprising
a bad information unit for storing an address of a bad memory block,
an address counter for counting an address according to an operational progress of the flash memory device and outputting the counted address, and
a comparator for comparing the counted address with a bad memory block address stored in the bad block information unit,
wherein the address controller disables the counted address while the counted address corresponds to an address of a bad memory block.

2. The flash memory device of claim 1, wherein the bad block information unit includes fuse circuits for storing a bad memory block address of the flash memory device.

3. The flash memory device of claim 1, wherein the bad block information unit includes storage means for storing information of a bad memory block.

4. A flash memory device, comprising:
a memory cell array including a plurality of memory blocks, each memory block including a plurality of memory cells each connected to a bit line pair and a word line;
a page buffer unit including a plurality of page buffer circuits, the page buffer circuits being constructed to program the memory cells, move a threshold voltage of the memory cells in a positive voltage direction and read data of the memory cells;
an X decoder for selecting a word line of the memory cell array according to an input address;
a Y decoder connected to each page buffer circuit and a data I/O line, wherein each Y decoder transmits program data to the corresponding page buffer circuit or outputs data received from the corresponding page buffer circuit to the data I/O line; and
a controller for outputting control signals of the page buffer unit, the X decoder and the Y decoder, and for outputting an address control signal, the address control signal disabling a memory block corresponding to the input address only while the input address corresponds to an address of a bad memory block.

5. The flash memory device of claim 4, wherein the controller comprises an address controller for comparing the memory block address included in the input address with previously stored bad block memory information, and for outputting the address control signal according to the comparison result.

6. The flash memory device of claim 5, wherein the address controller comprises:
a bad block information unit for storing address information of a bad memory block included in the flash memory device;
an address counter for counting an address according to an operational progress of the flash memory device and outputting the counted address; and
a comparator for comparing the counted address with a bad memory block address stored in the bad block information unit.

7. The flash memory device of claim 6, wherein the bad block information unit includes fuse circuits for storing an address of the bad memory block of the flash memory device.

8. The flash memory device of claim 6, wherein the bad block information unit includes storage means for storing information of the bad memory block.

9. The flash memory device of claim 6, wherein the X decoder disables an operation of a corresponding memory block in response to a disabling address control signal.

10. A flash memory device, comprising:
a memory cell array including a plurality of memory blocks, each memory block including a plurality of memory cells each connected to a bit line pair and a word line;

a page buffer unit including a plurality of page buffer circuits, each page buffer circuit being constructed to program the memory cells, move a threshold voltage of the memory cells in a positive voltage direction and read data of the memory cells;

an X decoder for selecting a word line of the memory cell array according to an input address;

a Y decoder connected to each page buffer circuit and a data I/O line, wherein each Y decoder transmits program data to the corresponding page buffer circuit or outputs data received from the corresponding page buffer circuit to the data I/O line; and a controller for outputting control signals to control an operation of the page buffer unit, the X decoder and the Y decoder, and for outputting an address control signal, the controller comprising an address controller for outputting the input address, the address control signal disabling a memory block corresponding to the input address only while the input address corresponds to an address of a bad memory block.

11. The flash memory device of claim 10, wherein the address controller comprises:

a bad block information unit for storing address information of a bad memory block included in the flash memory device;

an address counter for counting an address according to an operational progress of the flash memory device and outputting the counted address; and a comparator for comparing the counted address with a bad memory block address stored in the bad block information unit.

12. The flash memory device of claim 11, wherein the bad block information unit includes fuse circuits for storing an address of the bad memory block of the flash memory device.

13. The flash memory device of claim 11, wherein the bad block information unit includes storage means for storing information of the bad memory block.

14. The flash memory device of claim 11, wherein the X decoder disables an operation of a corresponding memory block in response to a disabling address control signal.

* * * * *